(12) United States Patent
Langguth et al.

(10) Patent No.: US 8,203,263 B2
(45) Date of Patent: Jun. 19, 2012

(54) LIGHT EMITTING ORGANIC COMPONENT WITH FUSE STRUCTURE

(75) Inventors: Oliver Langguth, Dresden (DE); Stephan Rentenberger, Dresden (DE); Sven Murano, Dresden (DE); Philipp Wellmann, Darmstadt (DE)

(73) Assignee: Novaled AG, Dresden (DE)

( * ) Notice: Subject to any disclaimer, the term of this patent is extended or adjusted under 35 U.S.C. 154(b) by 0 days.

(21) Appl. No.: 12/937,972

(22) PCT Filed: Jun. 13, 2008

(86) PCT No.: PCT/DE2008/000956
§ 371 (c)(1),
(2), (4) Date: Dec. 17, 2010

(87) PCT Pub. No.: WO2009/127174
PCT Pub. Date: Oct. 22, 2009

(65) Prior Publication Data
US 2011/0089820 A1 Apr. 21, 2011

(30) Foreign Application Priority Data
Apr. 15, 2008 (DE) .................. 10 2008 019 048

(51) Int. Cl.
*H01J 1/62* (2006.01)
(52) U.S. Cl. ..................... 313/504; 313/506
(58) Field of Classification Search .................. 313/498, 313/504, 506, 512
See application file for complete search history.

(56) References Cited

U.S. PATENT DOCUMENTS
2003/0010985 A1  1/2003  Shen

FOREIGN PATENT DOCUMENTS
| EP | 1003229 A1 | 5/2000 |
| EP | 1549110 A1 | 6/2005 |
| GB | 2392023 A | 2/2004 |
| WO | WO2008/099315 A2 | 8/2008 |

OTHER PUBLICATIONS

Kimura, M. et al. "Detection and Repair of Pixel Shorts in PM-OLEDs," IDWIAD Proceedings 2005, p. 605.
International Preliminary Report on Patentability for PCT/DE2008/000956, mailed Nov. 18, 2010.

*Primary Examiner* — Vip Patel
(74) *Attorney, Agent, or Firm* — Sutherland Asbill and Brennan LLP

(57) ABSTRACT

The invention relates to a light-emitting organic component, in particular a light-emitting organic diode, having an electrode and a counter electrode and an organic region located between the electrode and the counter electrode, the electrode having electrode sections, each of which are implemented at least partially overlapping and in contact with the organic region and which are electrically connected with each other by means of one or more further electrode sections, forming the electrode, and the electrode having an electrical safety structure allocated to the electrode sections. Furthermore, the invention relates to a method for the production of a light-emitting organic component, an array with several light-emitting organic components and an electrode structure for an electronic component.

15 Claims, 6 Drawing Sheets

LIGHT EMITTING ORGANIC COMPONENT WITH FUSE STRUCTURE

CROSS-REFERENCE TO RELATED APPLICATION

This is a submission pursuant to 35 U.S.C. 154(d)(4) to enter the national stage under 35 U.S.C. 371 for PCT/DE2008/000956, filed Jun. 13, 2008. Priority is claimed under 35 U.S.C. 119(a) and 35 U.S.C. 365(b) to German Patent Application Number 10 2008 019048.9, filed Apr. 15, 2008. The subject matters of PCT/DE2008/000956 and German Patent Application Number 10 2008 019048.9 are hereby expressly incorporated herein by reference in their entirety.

FIELD OF THE INVENTION

The invention relates to a light-emitting organic component, a production method and an array with several light-emitting organic components and an electrode structure.

BACKGROUND OF THE INVENTION

In recent years, organic light-emitting diodes (OLEDs) have become more and more important. Besides applications in the field of displays, applications for lighting purposes also have increasingly moved to the centre of development work. The big potential of the technology in this field has been recognized generically and it is assumed that OLEDs are going to become one of the most important technologies in the field of lamps in future. Meanwhile, both the performance efficiencies and the life of components have reached a competitive level in comparison to alternative lighting technologies, such as incandescent lamps, fluorescent lamps or inorganic LEDs.

Nevertheless, some technical obstacles which hitherto stand in the way of a commercial breakthrough in the market have not yet been overcome. One of these obstacles is to increase the total quantity of light a component can emit. This quantity of light is substantially determined by two factors, on the one hand the surface area of the OLED and on the other hand its light intensity. The latter can not be increased at will as increasing light intensity brings about an exponential reduction of the life. Furthermore, the area adjacent between the electrodes of the OLED will become that big with a certain light intensity that it leads to a breakdown and thus the formation of a short (circuit). To date, it is assumed that the application light intensities will be in the range of from 500 to 10,000 cd/m2.

Thus, enlarging the active lighting area primarily remains to increase the quantity of light. For future OLED applications in the lighting sector, the active areas are thus presumably going to lie within a range of a few square centimetres up to a square meter and more. As OLEDs typically are operated at a voltage of about 2-10 V and this voltage is independent of the area, the flowing current increases with increasing total area. For example, with a current efficiency of the component of 50 cd/A and an operating light intensity of 5000 cd/m2, a current of 1 ampere would already flow with a comparatively small area of 100 cm2.

Supplying such a high current would already cause hardly solvable problems in most practical applications. Another enlargement of the area would aggravate these problems further.

As a solution to this problem, it was already suggested to connect a plurality of small OLED elements with a comparatively small area in series (GB 2392023 A). Through this, the operating voltage of the component is increased by a factor which roughly corresponds to the number of OLED elements connected in series. At the same time, the operating current is likewise reduced by about this factor. Thus, the total quantity of light and the performance efficiency may be kept the same; however, the electrical actuation of the component is markedly simplified as it is usually considerably easier to supply a high operating voltage.

An advantageous characteristic of this serial connection of OLED elements within a component is that no interruption of the current path occurs in the case of the formation of a short between cathode and anode of an OLED element. Even if a part of the component, namely the OLED element with the short, no longer emits light in this case, the emitted total quantity of light of the component nevertheless remains virtually unchanged as a correspondingly higher voltage is now applied to the other, remaining elements. Thus, even after the formation of a short, such a component can still serve its purpose.

However, if a component solely consists of a single large OLED, the luminous power is reduced significantly after the formation of a short as now a large part of the current flows over the short circuit without being converted into light. If a constant distribution voltage is applied to the component, the flowing current would also dramatically increase which in many cases will result in a strong temperature rise at the point of the short. For these reasons, components having a single large OLED area can no longer be used after the formation of a short.

However, the production of OLED components with a serial connection of OLED elements is markedly more complex than the production of a single large diode.

Firstly, it is the structuring of the electrode on the substrate side is required for such a solution to define the sub-electrodes of the serial connection. Furthermore, the organic layers and the top electrode also have to be structured to construct the serial connection. In principle, such a structuring is possible by means of different methods. Provided that the organic materials of the OLED are processed by means of vacuum evaporation, such a structuring can take place by means of shadow masks. Processing of the organics by means of transfer methods in which the organic materials are transferred from a backing film by means of local heating by a laser beam onto the substrate is also possible. However, this method can only be employed for the organic layers, not for the top electrode which commonly consists of metals, such as aluminum, silver, calcium or magnesium, or transparent oxides, such as indium tin oxide (ITO). To structure these materials, deposition via shadow masks is commonly likewise reverted to.

However, all these mentioned structuring methods increase the complexity of the production process which also inevitably makes this more expensive. The resolutions achievable with shadow masks are furthermore limited so that the minimum distance between OLED elements of the serial connection is limited. Furthermore, using shadow masks becomes more elaborate when the structures on the substrates are becoming smaller. If structures in the range of several 100 μm are to be formed, a fine adjustment of the shadow mask towards the substrate is usually required which is time-consuming and costly and commonly is performed by means of microscopes. However, if the structures to be reproduced are enlarged to a certain dimension, as is the case with a size of the OLED elements of about 1 cm2, for example, the orientation of the shadow mask with regard to the substrate may be performed with less precision. Through this, a simple orientation is then possible, for example by means of positioning pins, which is markedly faster and cheaper than a fine adjustment within the micrometre range. The orientation of the shadow mask with regard to the substrate can take place by means of positioning pins on the substrate or the substrate holder.

The masks themselves also would have to be manufactured with less precision so that cheaper production methods such as laser cutting may be employed instead of cost-intensive lithography methods. By a mask orientation by means of positioning pins, the cycle time required for the processing of the substrates is also shortened.

An improvement of OLED lighting elements on the basis of simplified processing of larger OLED elements having a common organic layer structure on strip-shaped structured base contacts has already been proposed. In such a component architecture, only the base electrode is finely structured which may be performed by means of photolithography. As a structuring of the substrate by photolithography usually has to be performed anyway, this results in barely higher process costs. The advantage of the strip-shaped structuring of the base electrode arises from the fact that through this, several OLED strips are connected in parallel within an OLED element having a common organic layer and a common counter electrode. If the formation of a short occurs in such a structure, the current flow over the strips of the base electrode is limited by its electric resistance. Thus, not the entire OLED element is inoperable in the case of a short but only a substrip. However, the limitation of the current flow is determined by the exact position of the short on the strip. If the distance that the current has to cover over the electrode strip to the short with the counter electrode is short, the ohmic resistance is also low and a high current flows through the short and not through the intact strips of the OLED element connected in parallel. Through this, efficiency losses of the component can occur after a short has fanned. For this reason, it would be desirable to electrically isolate a strip damaged by a short from the other strips.

For OLED displays, an electric isolation of individual pixels from the actuation feeds has already been discussed (M. Kimura, Y. Kubo, Analysis, "Detection and Repair of Pixel Shorts in PM-OLEDs", IDWIAD Proceedings 2005, page 605). In this article, the authors suggest in the case of a pixel with a short to burn through the feed electrode made of metal or a conductive oxide by means of a laser beam or a high current pulse. However, both the separation by means of a laser and the burning-through of the feed by means of a current pulse requires a certain active effort. If the feed is to be cut through by means of a current pulse, it is furthermore required that the OLED region to be separated can be driven individually. Furthermore, the electrical feeds have to allow for such a high current flow without sustaining damage themselves. In any case, the actuation has to be performed actively by means of a current pulse, for example by means of suitable self-analysis and control electronics and thus does not take place directly and immediately via the formation of a short in the OLED element itself.

In the case of OLED lighting elements, it is typically not possible to electrically isolate a particular region by means of a current pulse.

The use of a laser for the separation is also highly complex. In particular for components which are already employed by the user, this method would require sending it in for repair which would cause high costs.

SUMMARY OF THE INVENTION

It is an object of the invention to specify technologies for improved failure behaviour in connection with electronic components, in particular light-emitting organic components. The technologies should preferably be employable both for individual light-emitting organic components and arrays with several light-emitting organic components.

This object is achieved according to the invention by a light-emitting organic component, in particular a light-emitting diode, having an electrode and a counter electrode and an organic region located between the electrode and the counter electrode, the electrode having electrode sections, each of which are implemented at least partially overlapping and in contact with the organic region and which are electrically connected with each other by means of one or more further electrode sections, forming the electrode, and the electrode having an electrical safety structure allocated to the electrode sections. Also provided herein in is a method for the production of a light-emitting organic component, in particular a light-emitting organic diode, in which an electrode and a counter electrode and an organic region located between the electrode and the counter electrode are formed, the electrode being produced with electrode sections, each of which are formed at least partially overlapping and in contact with the organic region and which are electrically connected with each other to the electrode by means of one or more further electrode sections, and the electrode being implemented with an electrical safety structure allocated to the electrode sections. Also provided herein is an array with several light-emitting organic components, in particular light-emitting organic diodes, each of which are formed with an allocated electrode and an allocated counter electrode and an organic region located between the allocated electrode and the allocated counter electrode, the allocated electrodes of the several light-emitting organic components being electrically connected with each other in a connection and a component safety structure allocated to the connection being formed. Furthermore, also provided is an electrode structure for an electronic component, in particular a light-emitting organic component, with an electrode made from electrode sections and one or more further electrode sections which electrically connect the electrode sections with each other, electrical safety structure allocated to the electrode sections being formed.

According to an aspect of the invention, a light-emitting organic component, in particular a light-emitting organic diode, having an electrode and a counter electrode and an organic region located between the electrode and the counter electrode is created, the electrode having electrode sections, each of which are implemented at least partially overlapping and in contact with the organic region and which are electrically connected with each other by means of one or more further electrode sections, forming the electrode, and the electrode having an electrical safety structure allocated to the electrode sections.

In a possible implementation in relation to an organic light-emitting component, the organic region is formed continuously or with separated subsections which nevertheless can be actuated with the same electrode. In the case of a continuous implementation, it may be implemented as a substantially closed individual region in terms of the surface coverage, for example in the form of a polygonal, a rectangular, a triangular or a round surface.

Another aspect of the invention relates to a method for the production of a light-emitting organic component, in particular a light-emitting organic diode, in which an electrode and a counter electrode and an organic region located between the electrode and the counter electrode are formed, the electrode being produced with electrode sections, each of which are formed at least partially overlapping and in contact with the organic region and which are electrically connected with each other to the electrode by means of one or more further electrode sections, and the electrode being implemented with an electrical safety structure allocated to the electrode sections.

Another aspect of the invention relates to an array with several light-emitting organic components, in particular light-emitting organic diodes, each of which are formed with an allocated electrode and an allocated counter electrode and an organic region located between the allocated electrode and the allocated counter electrode and implemented continuously, the electrode being produced with electrode sections, the allocated electrodes of the several light-emitting organic components being electrically connected with each other in a connection and a component safety structure allocated to the connection being formed. A method for the production of the array, in particular with regard to the implementation of the component safety structure, is then analogously based on the production of the light-emitting organic components.

According to another aspect of the invention, an electrode structure for an electronic component, in particular a light-emitting organic component, with an electrode made from electrode sections and one or more further electrode sections is provided which electrically connect the electrode sections with each other, an electrical safety structure allocated to the electrode sections being formed.

The electrically connected electrode sections may form a parallel or serial connection or a combination thereof. The electrode sections can preferably be regarded as electrode sections being formed at least partially separated or detached from each other.

In connection with the electrode configuration in electronic components, in particular light-emitting organic components, the invention encompasses the idea to provide an electrical safety structure allocated to the electrode configuration, be it in the allocation for the separately actuable electrode of an individual component or for the multi-electrode structure in an array with several components. The multi-electrode structure is formed from the interconnected electrodes of the individual components, each of which may be individually actuated for the operation of the components, thus it being possible to apply an operating voltage desired in each case independently of one another. Each electrode, be it in the individual element or in the array of several components, interacts with an allocated counter electrode.

In the case of the component array, the safety structure is an electrical component safety structure which, in the case it is triggered, causes an electric isolation between individual components. This again can be combined with the safety structure within the individual component for individual or several components included in the array.

In the sense intended herein, the individual light-emitting organic component or element is determined by an organic region which is formed continuously, for example, being allocated exactly an independently actuable electrode which itself by all means may include several interconnected and collectively actuable sub-electrodes and to which during operation an electrical potential is applied to generate light in the organic region. The optionally provided sub-electrodes then always are on the same electrical potential. In comparison, the array with several light-emitting organic components is formed in which several components or elements, each of which possessing their own organic region, which in each case is formed continuously and can be actuated via an allocated electrode. In the case of the implementation of the individual components as a light-emitting organic diode, these may also be referred to as OLED elements.

The electrical safety structures have in common that they interrupt an electrical connection in a self-triggering or self-actuating manner when a limiting current settable by means of the construction of the safety structure is exceeded, such that an electric isolation is established. In this connection, the electrical safety structure is implemented such that the isolating effect in the case of the occurrence of a multiple of the usual operating current is triggered in a self-actuating manner for the component(s). The construction of the electrical safety structure is to be chosen in such a way that the customary operation of the component(s) is ensured, on the one hand, and the self-triggering takes place when an increased current occurs, on the other hand. Depending on the application case, however, the person skilled in the art has the customary design options with regard to material and implementation of the structure, for example the cross-section of the conductors of electrical connections, at his disposal. In this respect, the electrical safety structure may also be referred to as self-triggering or self-isolating safety structure.

A preferred further development of the invention provides for the one or more further electrode sections being formed external to the organic region. Due to the forming of the further electrode section(s) external to the organic region which corresponds with an array of the one or more further electrode section(s) not overlapping with the organic region, these may also be referred to as external electrode sections.

In a practical implementation of the invention, it may be provided for the electrical safety structure being formed with a safety substructure which is allocated to a subset of the electrode sections, and a further safety substructure which is allocated to a further subset of the electrode sections. As an alternative to this implementation, a safety structure being common to all the electrode sections may also be provided.

An advantageous embodiment of the invention provides for the electrical safety structure being formed with at least one individual safety structure which is allocated to an individual electrode section of the electrode sections. Combinations of one or more individual safety structures on the one hand and safety substructures on the other hand may also be provided.

Preferably, a further development of the invention provides for the organic region being formed with the same material makeup over its planar expansion. This may be provided for both in the case of the continuous implementation and for the separate sub-regions allocated to the electrode. The similar or uniform implementation or composition of the organic region over its planar expansion particularly means that light of the same colour is emitted. So-called RGB structures with individual elements of different colours are known in which red, blue or green light is in each case emitted in sub-regions to form so-called RGB displays, for example, and in which the sub-regions may be operated by separately actuable electrodes such that individual settable operating voltages can be applied. The sub-regions per se each have a uniform material composition. In the case of the same composition, a uniform composition of the material(s) for the emitter system is given over the planar expansion.

In an advantageous implementation of the invention, it may be provided for the electrical safety structure having a layer made of organic material. The organic layer can be an electrically doped layer. The implementation is performed as a p-doped or n-doped semiconductor layer. The electrical safety structure may be formed completely or partially with the electrically doped layer. In a preferred implementation, the electrically doped layer is formed corresponding with the layers from the organic region with regard to its material composition which has the advantage that the electrically doped layer of the safety structure can be created during the production simultaneously with the layer in the organic region implemented in the same way as long as this can be conveniently integrated into the production process. The electrically doped layer is preferably formed having a layer thickness between about 10 nm and about 100 µm. A layer thickness of about 10 nm is considered as a thickness which is at least required to safely form a closed organic layer with customary production lines. 100 µm is a layer thickness which can still be realised within an appropriate technical process scope.

Alternatively or additional to the forming of the electrically doped layer, a layer made of organic material which is not electrically doped may be provided for in an implementation of the safety structure. With regard to the layer thickness of the undoped organic layer, above explanations relating to the doped organic layer apply accordingly.

A further development of the invention may provide for the electrical safety structure having a metal layer. The electrical safety structure may be formed completely or partially of the metal layer such that in an implementation, it consists of the metal layer. An implementation may also provide for the electrical safety structure consisting of the metal layer and the layer made of organic material. In an implementation, the metal layer can be combined with at least one of the following layers, namely the electrically doped organic layer and the organic layer which is undoped. The metal layer can cover the organic layer in sections or completely. In this connection, it may be provided for in an embodiment that the metal layer covers the layer made of organic material in sections or completely. The organic layer, be it electrically doped or not, may be formed in contact with the allocated electrode sections or the further electrode sections or without contact therewith. In the different implementations, the metal layer may be in electrical contact only with the allocated electrode sections, only with the one or more further electrode sections or with both.

The organic layer has a layer thickness between about 10 nm and about 50 µm, for example. The metal layer is preferably formed having a layer thickness between about 10 nm and about 10 µm.

The layer thicknesses are chosen in such a way that in the case of a short within the area of the electrode sections and the increased current flow associated therewith, the electrically doped layer is warmed to such a great extent that it is electrically isolated, for example by melting. The organic material of the electrically doped layer and the substrate surface on which the light-emitting organic component is formed are chosen such that the electrically doped layer decrosslinks when melting. In the combination with the metal layer, this is thin enough to tear in the case of the decrosslinking. Furthermore, the metal layer is so thin that in the case of a short, a sufficiently high heat is generated by the ohmic resistance to cause a melting of the electrically doped layer made of organic material. The combination of metal layer and electrically doped layer made of organic material has the advantage that the temperature at which the electric isolation effect is triggered by the safety structure can be selected precisely. Through this, the electrical safety structure can be adapted to individual application purposes by means of the parameters of melt temperature of the electrically doped layer, thickness of the metal layer and design of the light-emitting organic component and the current flow resulting from this.

The melting of organic materials often already takes place at temperatures below 200° C. Electrical safety structures based on metals or other organic electric conductors only blow at markedly higher temperatures.

Thin films made of organic material even may already decrosslink below their melt point which often occurs in connection with liquid-crystalline materials, for example. In a preferred implementation, the organic layer of the safety structure is made of a liquid-crystalline material.

Another advantage of the combination of organic layer which is optionally electrically doped and metal layer for the electrical safety structure consists in that the metal layer can be chosen to be relatively thick as it does not need to heat up to such a high temperature in the case of the short as this is the case with a purely metallic safety structure. Through this, the ohmic losses at the safety structure during normal operation can be reduced. However, it has to be taken care that the metal layer is thin enough to be broken through one of the layers made of organic material.

A preferred further development of the invention provides for the electrical safety structure having a layer made of a material selected from the following materials: conductive oxide and conductive ceramics.

In a practical implementation of the invention, it can be provided for the electrical safety structure being implemented as a safety fuse structure. When activating the electrical safety structure due to an increased current, melting takes place, resulting in an electric isolation occurring.

An advantageous embodiment of the invention provides for the electrode sections each being formed at least partially as a strip electrode section. The strip electrode sections may be arranged in any manner. The structural shape of the strip electrode sections may also be chosen randomly, depending on the application case. A strip-shaped implementation is possible both with straight electrode sections and with electrode sections which are not straight, for example in the shape of zigzags or as a sinuous line.

A further development of the invention preferably provides for the electrode having comb-shaped sub-electrodes in which the electrode sections being formed thereto and separated from each other are arranged intermeshing at least in areas. The comb-shaped sub-electrodes which, forming the electrode, can be collectively actuated may be formed corresponding to different geometrical basic shapes, intermeshing sections of opposing sub-electrodes conveniently having a complementary implementation, for example an inversed conical implementation. Strip electrodes in the shape of zigzag or sinuous lines may also be arranged in an intermeshing manner.

The advantageous implementations described above for the light-emitting organic component or elements may analogously used in connection with the array with several light-emitting organic components, as far as they are not specifically limited to an individual component.

In an advantageous implementation, the several light-emitting organic components may be formed on a common substrate such that several light-emitting organic components are produced on the same substrate. The component safety structure and—if this is provided for one or more of the components—the safety structure as was described above for the individual component may then also be formed on the same substrate.

The electrodes of the different components secured by means of the component safety structure and separately actuable can be interconnected with each other in accordance with a parallel connection or a serial connection or a combination thereof. In the implementation of the light-emitting organic components as a light-emitting organic diode, so-called OLED elements or components can be interconnected with each other and secured in this manner.

The implementation possibilities for the electrode described above in connection with a component may also be provided individually or in any combination in connection with the electrode structure as such, it being possible to produce the electrode structure as an independent product or semi-finished product, just as an electrode production can be implemented integrated with the component production, be it in the case of an organic light-emitting component or another electronic component. A separate production of the electrode structure with the electrode in the different implementations may for example be achieved by simply interrupting the described production processes after the electrode has been formed without continuing with the formation of the organic region. The electrode structure thus formed may then be employed for any electronic components. These include in particular organic solar cells. The advantages described above, as far as their origin lies in the electrode implementation as such, accordingly result in the different implementations for the electrode structure.

In the following, preferred implementation in connection with the electrode structure are explained in even more detail, the explanations given above accordingly apply in connection with identical features, these explanations being omitted in the following to avoid repetitions.

In the case of the electrode structure, in a practical implementation of the invention, it may be provided for the electrical safety structure being formed with a safety substructure which is allocated to a subset of the electrode sections, and a further safety substructure which is allocated to a further subset of the electrode sections. As an alternative to this implementation, a safety structure being common to all the electrode sections may also be provided.

In the case of the electrode structure, an advantageous embodiment of the invention provides for the electrical safety structure being formed with at least one individual safety structure which is allocated to an individual electrode section of the electrode sections.

In the case of the electrode structure, in an advantageous implementation of the invention, it may be provided for the electrical safety structure having a layer made of organic material.

In the case of the electrode structure, a further development of the invention may provide for the electrical safety structure having a metal layer.

In the case of the electrode structure, a preferred further development of the invention provides for the electrical safety structure having a layer made of a material selected from the following materials: conductive oxide and conductive ceramics.

In the case of the electrode structure, in a practical implementation of the invention, it can be provided for the electrical safety structure being formed as a safety fuse structure. When activating the electrical safety structure due to an increased current, melting takes place, resulting in an electric isolation occurring.

In the case of the electrode structure, an advantageous embodiment of the invention provides for the electrode sections each being formed at least partially as a strip electrode section.

In the case of the electrode structure, a further development of the invention preferably provides for the electrode having comb-shaped sub-electrodes in which the electrode sections being formed thereto and separated from each other are arranged intermeshing at least in areas.

BRIEF DESCRIPTION OF THE FIGURES

In the following, the invention is explained in more detail using preferred exemplary embodiments with reference to figures. They show.

This structure can be implemented both with a doped organic layer and with an undoped and non-conductive organic layer as the current path does not (necessarily) lead through the organic layer.

Figure 3:
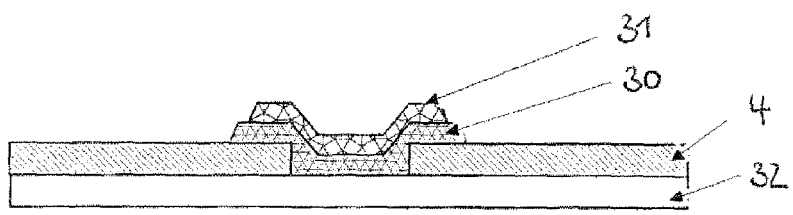
Figure 4:
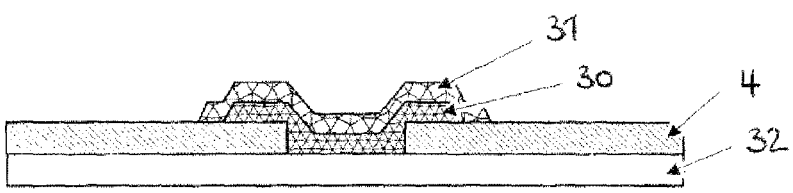
Figure 5:
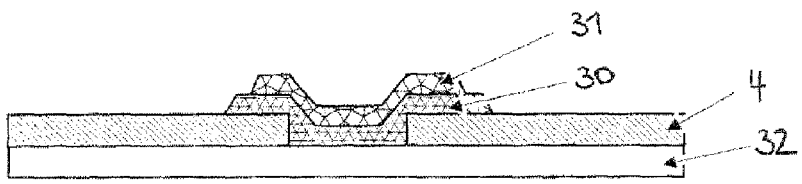
Figure 6:
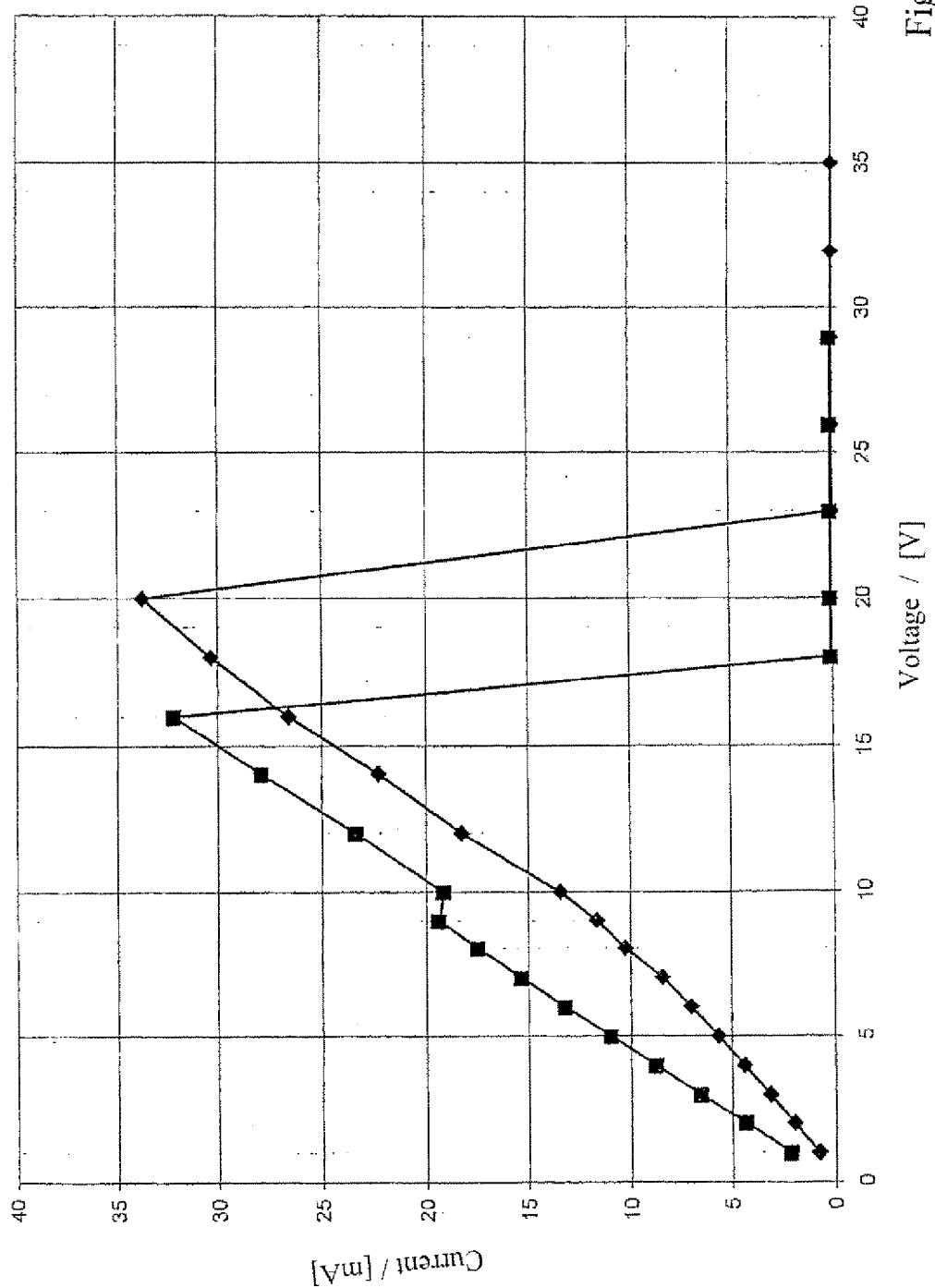
Figure 7:
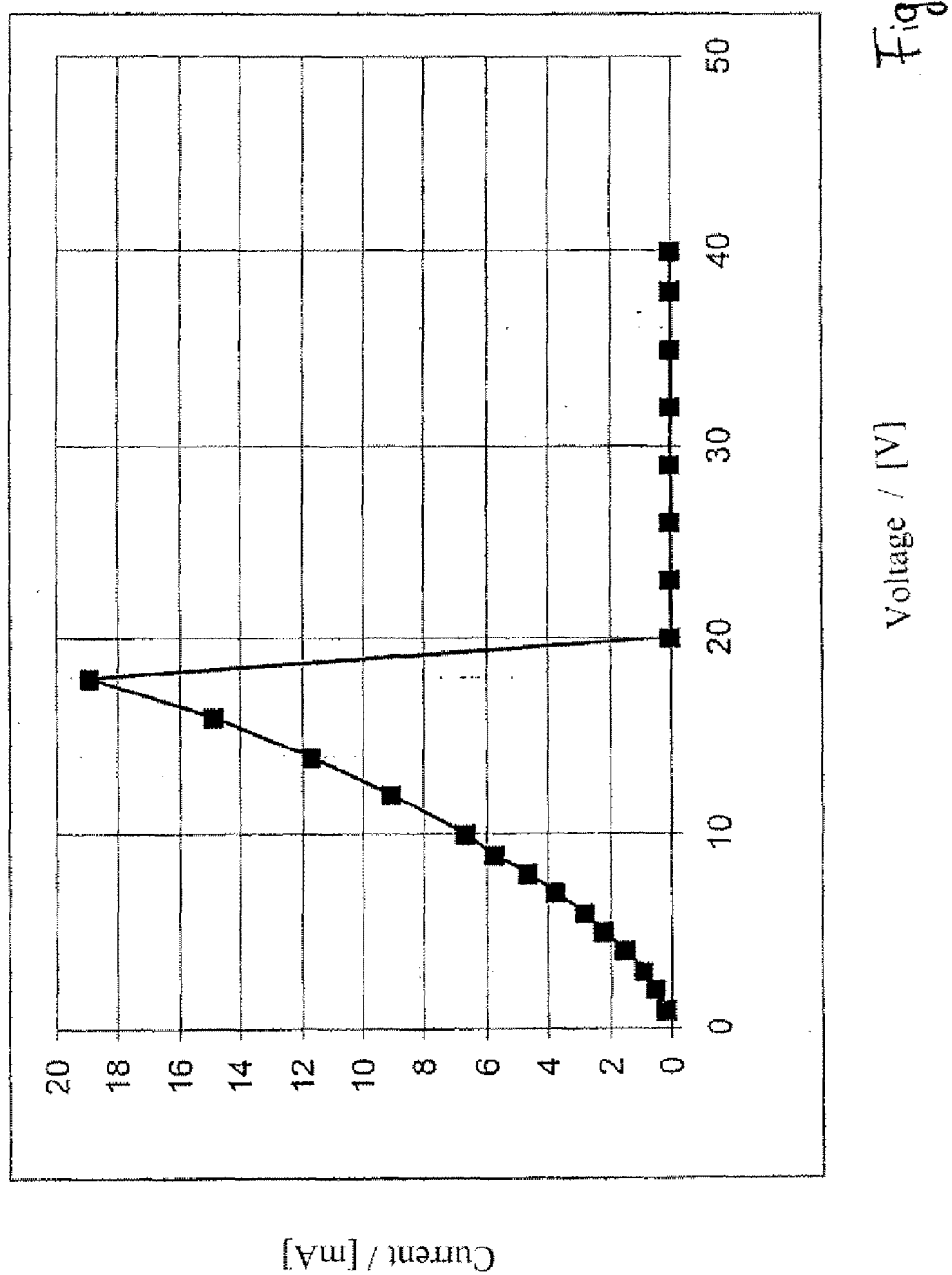
Figure 8:
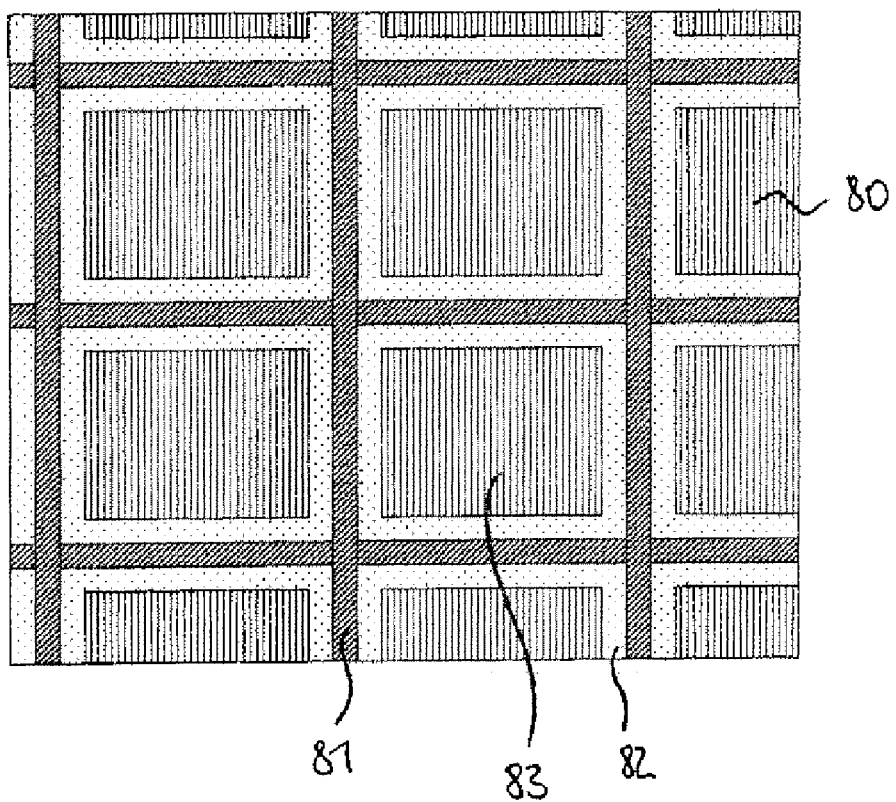
Figure 9:
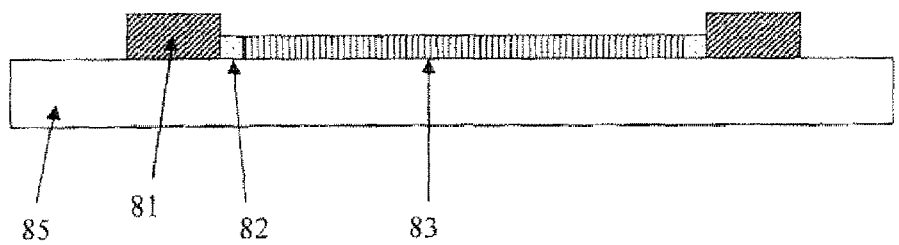

FIG. 5 a schematic sectional view of a section of an electrode structure of an electrical safety structure in which an electrically doped layer made of organic material is covered in a unilaterally enclosing manner by a metal layer, FIG. 6 a current-voltage characteristic for a safety structure in accordance with FIG. 4 for different organic materials, namely Pen (squares) and NPD (kite), FIG. 7 a current-voltage characteristic for a safety structure in accordance with FIG. 3, FIG. 8 a schematic illustration of a section of an optically transparent electrode made of ITO with a metal grid formed thereon, and FIG. 9 a schematic sectional view of the optically transparent electrode of FIG. 8.

DETAILED DESCRIPTION

Figure 1:
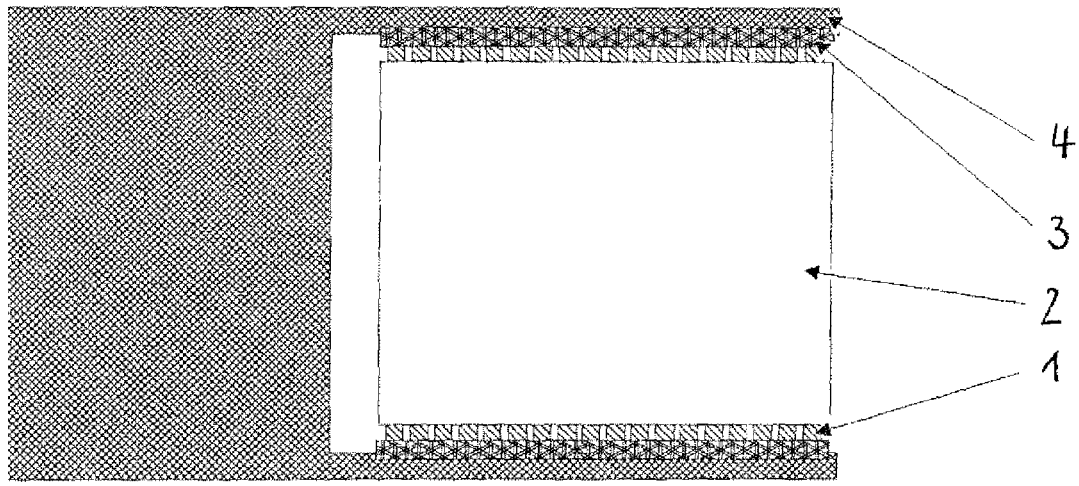
FIG. 1 a schematic partial illustration of a light-emitting organic component.

FIG. 1 shows a schematic partial illustration of a light-emitting organic component. Strip-shaped electrode sections 1 are arranged beneath an organic region 2 and are electrically coupled via an electrical safety structure 3 on outer electrode sections 4 which form a kind of feed. The strip-shaped electrode sections 1 and the outer electrode sections 4 together form an electrode of the component via which an electrical operating voltage is applied to the organic region 2 during the interaction with an allocated counter electrode (not shown) such that free charge carriers in the form of holes and electrodes are generated at that point which then recombine with emission of light as is generally known for light-emitting organic components.

The organic region 2 is formed with a uniform material composition over its planar expansion such that light of a uniform colour is emitted. However, the precise implementation of the organic region 2 can be chosen randomly, depending on the application case. For this, the different known designs of light-emitting organic components are available. The organic region 2 is processed in a customary manner, for example by means of vacuum evaporation, imprinting or other known layer formation methods. A combination of these methods may also be used. In this connection, it is known to use masks to produce particular layers only in sub-regions of the components. Such masks which are also referred to as shadow masks may be used to produce the electrical safety structure 3—if this comprises organic embodiment in an implementation—together with a layer from the organic region 2 such that the electrical safety structure 3 is at least partially made of the same material composition as the simultaneously produced layer in the organic region 2. For example, the organic layer in the safety structure 3 can be an electrically doped layer made of matrix material and material doped therein. Different implementations of such electrically doped layers are known as such to the person skilled in the art.

An active, light-emitting region of the component is formed within the overlapping region between electrode sections 1 and organic region 2.

The organic region 2 produced by means of using shadow masks is large enough to use simple shadow masks and processes. Nevertheless, the strip-shaped electrode sections 1 are in comparison small and only limited by the process of processing the electrode with regard to their dimensions. Their processing may be performed by means of photolithography, for example, through which very small dimensions within the micrometre range can be produced. In general, the methods known as such for the electrode processing can be used.

Figure 2:
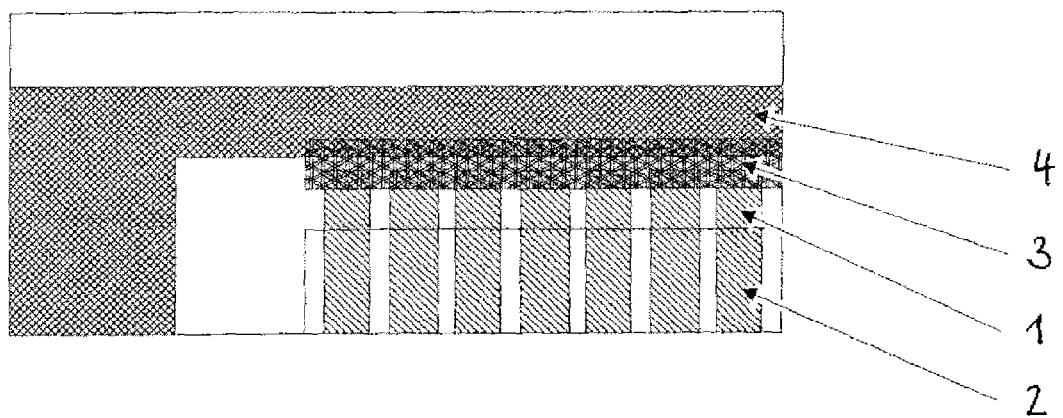
FIG. 2 a schematic illustration of a section of the component in FIG. 1 in detail, FIG. 3 a schematic sectional view of a section of an electrode structure of an electrical safety structure in which an electrically doped layer made of organic material is partially covered by a metal layer, FIG. 4 a schematic sectional view of a section of an electrode structure of an electrical safety structure in which an electrically doped layer made of organic material is completely covered by a metal layer.

FIG. 2 shows a schematic illustration of a section of the component in FIG. 1 in detail.

FIG. 3 shows a schematic sectional view of a section of an electrode structure having an electrical safety structure in which an electrically doped layer 30 made of organic material is partially covered by a metal layer 31. A current path runs over the metal layer and partially over the electrically doped layer 30. Furthermore, a substrate 32 is shown onto which the component(s) are applied. In the depicted embodiment, the electrically doped layer 30 is not in contact with the outer electrode sections 4.

In an exemplary embodiment, the electrical safety structure in accordance with FIG. 3 has the construction described below. Initially, a layer of 2,4,7,9-tetraphenyl-1,10-phenanthroline, doped with 8 percent by weight of tetrakis-(1,3,4,6,7,8-hexahydro-2H-pyrimido[1,2-a]pyrimidinato)ditungsten, about 2.54 mm wide and about 100 nm thick, is evaporated onto two adjacent parallel ITO strips having a thickness of about 90 nm and a distance of about 1.27 mm to one another, the layer covering in each case the entire width of the two ITO strips. Now, in a second step, an about 8 nm thick aluminum layer having a width of about 2.5 mm was evaporated over the organic n-doped layer, the aluminum layer not being in direct contact with any of the two ITO strips. Now, a voltage was applied between the two ITO strips and the flowing current was measured. When reaching a current of about 19 mA, the electrical conductivity collapsed.

FIG. 7 shows a current-voltage characteristic for a safety structure in accordance with FIG. 3.

FIG. 4 shows a schematic sectional view of a section of an electrode structure having an electrical safety structure in which, in contrast to FIG. 3, an electrically doped layer 30 made of organic material is completely covered by the metal layer 31. In the depicted embodiment, the electrically doped layer 30 is unilaterally in contact with the outer electrode sections 4. In an alternative implementation (not shown), an electrically undoped layer is provided as the organic material in place of the electrically doped layer, wherein the layer build-up can take place in the same way as FIG. 4 shows. In this implementation, the organic material does not have to be electrically conductive as a current path does not necessarily run over the organic material.

In an exemplary embodiment, the electrical safety structure in accordance with FIG. 4 has the construction described below. Initially, an organic layer of about 20 nm of NPD (N,N'-di(naphthalen-1-yl)-N,N'-diphenyl-benzidine) was deposited on two adjacent parallel ITO strips having a thickness of about 90 nm and a distance of about 1.27 mm to one another. Here, the organic layer covered the ITO strips only partially, but the region between the strips completely on a width of about 2.54 mm. Now, an about 20 nm thick aluminum layer was evaporated onto this by means of a shadow mask in such a way that it covered the organic layer on a width of about 2.5 mm and was in direct electrical contact with both ITO strips. Now, a voltage was applied in each case to these components between the two ITO strips and the flowing current was recorded.

FIG. 6 shows a current-voltage characteristic for an electrode structure having the safety structure in accordance with FIG. 4 for different organic materials, namely Bphen (squares) and NPD (kite). The thickness of the metal layer was kept constant for the different organic materials. For the material with the higher glass temperature (NPD), a higher voltage/current also results at which the safety structure is destroyed. The layer made of organic material is not electrically doped. The outcome of this is that, when reaching a critical current (in the case of BPhen about 33 mA and in the case of NPD about 34 mA), the current flow collapses as the metal layer is heated to such a great extent that the underlying organic layer is melted through which the metal web between the two ITO strips was interrupted.

FIG. 5 shows a schematic sectional view of a section of an electrode structure having an electrical safety structure in which the electrically doped layer 30 made of organic material is covered in a unilaterally enclosing manner by the metal layer 32. A current path runs over the electrically doped layer 30.

To improve the layer conductivity in optically transparent electrodes, the planar and optically transparent electrode is often superposed with a metal grid in light-emitting organic components. A big part of the current flows through the metal grid with low ohmic losses.

FIG. 8 shows a schematic illustration of a section of an optically transparent electrode 80 made of ITO with a metal grid 81 formed thereon. In one of the above-mentioned embodiments, electrical safety structures 82 are formed on both sides along the metal grid 81. By means of the metal grid 81, the homogeneity of the lighting appearance of the component can be substantially improved, in particular for bigger areas. By means of the electrical safety structure 82, such an electrode structure is protected from shorts. As a result of the metal grid 81, sub-regions 83 of the optically transparent electrode 80 are formed. If a short now forms in one of the sub-regions 83, this sub-region is electrically isolated from the webs of the metal grid 81 by means of the electrical safety structure 82.

FIG. 9 shows a schematic sectional view of the optically transparent electrode 80 of FIG. 8, a carrier substrate 85 also being depicted.

The described embodiments may be used both to form the safety structure in any electronic components, in particular an individual light-emitting organic component, and also to implement the component safety structure between interconnected light-emitting organic components.

The features of the invention disclosed in the above description, the claims and the drawing can be of importance both taken on their own and in any combination to implement the invention in its different embodiments.

The invention claimed is:
1. A light-emitting organic component comprising
an electrode structure
a counter electrode, and
an organic region arranged between the electrode structure and the counter electrode, wherein the electrode structure comprises an electrode comprising two or more first electrode sections, and one or more second electrode sections which electrically connect the first electrode sections with each other, and wherein the first electrode sections comprise an electrical safety structure, wherein the electrical safety structure comprises a layer comprising an organic material and a metal layer, and wherein the first electrode sections at least partially overlap and contact the organic region.

2. The component according to claim 1, wherein the one or more second electrode sections are external to the organic region.

3. The component according to claim 1, wherein the electrical safety structure comprises a safety substructure allocated to a first subset of the first electrode sections, and a second safety substructure allocated to a second subset of the electrode sections.

4. The component according to claim 1, wherein the electrical safety structure comprises at least one individual safety structure allocated to an individual electrode section of the first electrode sections.

5. The component according to claim 1, wherein the organic region comprises the same material makeup over its planar expansion.

6. The component according to claim 1, wherein the organic material is electrically doped.

7. The component according to claim 1, wherein the first electrode sections comprise a strip electrode section.

8. The component according to claim 1, wherein the first electrode sections comprise comb-shaped sub-electrodes, and wherein the first electrode sections are at least partially arranged in an intermeshing pattern.

9. An array comprising two or more light-emitting organic components, wherein at least one of the two or more light-emitting organic components comprises
two or more allocated electrodes,
an allocated counter electrode, and
an organic region arranged between the allocated electrodes and the allocated counter electrode, wherein the allocated electrodes of the at least one of the two or more light-emitting organic components are electrically connected with each other in a connection, and wherein the connection comprises a component safety structure, wherein the component safety structure comprises a layer comprising an organic material and a metal layer.

10. The array according to claim 9, wherein the two or more light-emitting organic components are arranged on a common substrate.

11. An electrode structure for an electronic component comprising an electrode comprising two or more first electrode sections, and one or more second electrode sections which electrically connect the first electrode sections with each other, and wherein the first electrode sections comprise an electrical safety structure, wherein the electrical safety structure comprises a layer comprising an organic material and a metal layer.

12. The electrode structure according to claim 11, wherein the organic material is electrically doped.

13. The electrode structure according to claim 11, wherein the electrical safety structure comprises a safety fuse structure.

14. The electrode structure according to claim 11, wherein the first electrode sections comprise a strip electrode section.

15. The electrode structure according to claim 11, wherein the electrode comprises comb-shaped sub-electrodes, and wherein the first electrode sections are at least partially arranged in an intermeshing pattern.

* * * * *